United States Patent
Chung et al.

(10) Patent No.: US 8,623,746 B2
(45) Date of Patent: Jan. 7, 2014

(54) POLYSILICON LAYER, METHOD OF PREPARING THE POLYSILICON LAYER, THIN FILM TRANSISTOR USING THE POLYSILICON LAYER, AND ORGANIC LIGHT EMITTING DISPLAY DEVICE INCLUDING THE THIN FILM TRANSISTOR

(75) Inventors: Yun-Mo Chung, Yongin (KR); Ki-Yong Lee, Yongin (KR); Jin-Wook Seo, Yongin (KR); Kil-Won Lee, Yongin (KR); Bo-Kyung Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/012,619

(22) Filed: Jan. 24, 2011

(65) Prior Publication Data
US 2011/0253987 A1 Oct. 20, 2011

(30) Foreign Application Priority Data
Apr. 14, 2010 (KR) .......................... 10-2010-0034388

(51) Int. Cl.
*H01L 51/52* (2006.01)
*H01L 29/786* (2006.01)

(52) U.S. Cl.
USPC ................... 438/481; 438/488; 257/E29.293

(58) Field of Classification Search
USPC ................................................ 438/481, 488
See application file for complete search history.

(56) References Cited

U.S. PATENT DOCUMENTS

| | | |
|---|---|---|
| 2006/0024981 A1 | 2/2006 | Nakamura et al. |
| 2006/0073648 A1 | 4/2006 | Park et al. |
| 2008/0095975 A1 | 4/2008 | Jang et al. |
| 2009/0050893 A1* | 2/2009 | Park ................................ 257/72 |
| 2010/0059749 A1* | 3/2010 | Takahashi et al. ............. 257/57 |

FOREIGN PATENT DOCUMENTS

| | | |
|---|---|---|
| KR | 10-2005-0039023 A | 4/2005 |
| KR | 10-2005-0117467 A | 12/2005 |
| KR | 10-2006-0048825 A | 5/2006 |
| KR | 10-2008-0036502 A | 4/2008 |
| KR | 10-0859761 B1 | 9/2008 |
| KR | 10-0864883 B1 | 10/2008 |
| KR | 10-2009-0107700 A | 10/2009 |

OTHER PUBLICATIONS

Korean Registration Determination Certificate issued by the Korean Intellectual Property Office dated Jun. 23, 2011, 5 pages.

* cited by examiner

*Primary Examiner* — Alexander Ghyka
(74) *Attorney, Agent, or Firm* — Knobbe Martens Olson & Bear, LLP

(57) ABSTRACT

A method of crystallizing a silicon layer. An amorphous silicon layer is formed on a buffer layer on a substrate. A catalyst metal layer is formed on the amorphous silicon layer to have a density of from about $10^{11}$ to about $10^{15}$ atom/cm$^2$. A crystalline seed having a pyramid shape is formed on an interface between the amorphous silicon layer and the buffer layer as a catalyst metal of the catalyst metal layer diffuses into the amorphous silicon layer. The amorphous silicon layer is thermal-treated so that a polysilicon layer is formed as a silicon crystal grows by the crystallization seed.

9 Claims, 17 Drawing Sheets

(a)  (b)

POLYSILICON LAYER, METHOD OF PREPARING THE POLYSILICON LAYER, THIN FILM TRANSISTOR USING THE POLYSILICON LAYER, AND ORGANIC LIGHT EMITTING DISPLAY DEVICE INCLUDING THE THIN FILM TRANSISTOR

CROSS-REFERENCE TO RELATED PATENT APPLICATION

This application claims the benefit of Korean Patent Application No. 10-2010-0034388, filed on Apr. 14, 2010, in the Korean Intellectual Property Office, the disclosure of which is incorporated herein in its entirety by reference.

BACKGROUND

1. Field

The present embodiments relate to a polysilicon layer, a method of crystallizing a silicon layer, a thin film transistor (TFT) using the polysilicon layer, and an organic light emitting display device including the polysilicon layer.

2. Description of the Related Technology

A thin film transistor (TFT) is a type of an electric field effect transistor (FET) prepared by using a semiconductor thin film on an insulting support substrate. Like an electric FET, a TFT can include three devices, e.g., a gate, a drain, and a source, and performs a switching operation. The TFT performs the switching operation by adjusting a voltage supplied to the gate so as to turn a current flowing between the source and the drain on or off. TFTs are used in a sensor, a memory device, an optical device, or the like, and can be used as a pixel switching device or a driving device of a flat panel display.

Currently, commercialized products, such as lap tops, personal computers (PCs), monitors, televisions (TVs), and mobile devices, mostly use an amorphous silicon TFT (a-Si TFT). Amorphous silicon does not have a regular atom arrangement like a crystal, and has a short distance order but not a long distance order. The amorphous silicon is mostly used in TFTs since it is easily deposited in a large area and is easily prepared on a glass substrate at a low temperature. However, as a size and quality of a display increase, a device needs to operate at a high performance. Accordingly, a high performance TFT having higher electron mobility than the amorphous silicon TFT having electron mobility of about 0.5 to 1 cm$^2$/Vs, and a method of preparing the high performance TFT are required.

The polysilicon TFT (poly-Si TFT) has superior performance to a conventional a-Si TFT. Since the poly-Si TFT has electron mobility of tens to hundreds of cm$^2$/Vs, the poly-Si TFT may be built in a data driving circuit or peripheral circuits that require high mobility. Also, since a size of a channel of a transistor may be decreased, an aperture ratio of a screen may be increased. Also, since a wiring pitch, which is used to connect the data driving circuits according to an increase in pixel numbers, is not limited due to the built-in data driving circuit, high resolution is possible, a driving voltage and power consumption may be reduced, and a device's characteristic deterioration may be very low.

A method of preparing polysilicon may be classified into a low temperature process and a high temperature process, according to a process temperature. Here, the high temperature process is performed at a particular temperature or above when an insulating substrate deforms, and thus an expensive quartz substrate having high thermal resistance is used instead of a glass substrate. Also, a polysilicon thin layer formed according to the high temperature process has low quality crystallization, which results in high surface roughness or minute grains.

The low temperature process is a technology of crystallizing amorphous silicon into polysilicon, and excimer laser crystallization (ELC), crystallization using a metal as a catalyst, etc. are being studied. Here, in an ELC process, a pulse shape laser beam is irradiated onto a substrate so as to melt and coagulate amorphous silicon in units of nano seconds. However, such an ELC process is expensive, takes a long time, and is inefficient.

FIGS. 1A and 1B are conceptual diagrams illustrating crystal growth characteristics of silicon in methods of crystallizing silicon by using a metal as a catalyst. FIG. 1A shows the crystal growth characteristics of silicon according to metal induced crystallization (MIC), and FIG. 1B shows the crystal growth characteristics of silicon according to metal induced lateral crystallization (MILC). In the MIC, a relatively large amount of catalyst metal is deposited on amorphous silicon and is crystallized at a high temperature, and as shown in FIG. 1A, small linear polysilicon is grown randomly. In the MILC, a metal used as a catalyst is arranged in a line on amorphous silicon by using a mask and then deposited, thereby growing polysilicon in one direction as shown in FIG. 1B.

SUMMARY OF CERTAIN INVENTIVE ASPECTS

Aspects of the present embodiments provides polysilicon thin layers, which have high quality crystals, and have a crystalline catalyst metal distributed away from the bottom of a channel region so that leakage current characteristics are satisfactory, methods of crystallizing amorphous silicon into the polysilicon thin layer by using a catalyst metal, thin film transistors (TFTs) using the polysilicon thin layer, and flat panel display devices including the TFTs.

According to an aspect of the present embodiments, there is provided a method of crystallizing a silicon layer, the method including: forming an amorphous silicon layer on a buffer layer on a substrate; forming a catalyst metal layer on the amorphous silicon layer to have a density of $10^{11}$ to $10^{15}$ atom/cm$^2$; and thermal-treating the amorphous silicon layer so that a crystalline seed having a pyramid shape is formed on an interface between the amorphous silicon layer and the buffer layer as a catalyst metal of the catalyst metal layer diffuses into the amorphous silicon layer, and a polysilicon layer is formed as a silicon crystal grows by the crystallization seed.

The silicon crystal may grow in a same direction as the crystallization seed having the pyramid shape. The silicon crystal may first grow in a direction (111), and then in various directions including direction (110).

A component of the catalyst metal may exist on an interface between the polysilicon layer and the buffer layer, after the polysilicon layer is formed.

The crystallization seed may include silicide of the catalyst metal.

The catalyst metal layer may include at least one selected from the group consisting of Ni, Pd, Ti, Ag, Au, Al, Sn, Sb, Cu, Co, Mo, Tr, Ru, Rh, Cd, and Pt.

According to another aspect of the present embodiments, there is provided a thin film transistor (TFT) including: a substrate; a buffer layer disposed on the substrate; an active layer disposed on the buffer layer, including a source region, a drain region, and a channel region, and comprising a polysilicon layer; a gate insulation layer disposed on the active layer; a gate electrode facing the channel region on the gate insulation layer; and a source electrode and a drain electrode respectively contacting the source region and the drain region by penetrating through a first interlayer insulating layer disposed on the gate electrode, the active layer, and the buffer layer, wherein the polysilicon layer includes a crystallization seed having a pyramid shape on an interface between the buffer layer and the polysilicon layer.

The size of a crystal of the polysilicon layer may be in a range from several to hundreds of μm. A direction of a crystal of the polysilicon layer may include a direction (111).

The crystallization seed may include at least one selected from the group consisting of Ni, Pd, Ti, Ag, Au, Al, Sn, Sb, Cu, Co, Mo, Tr, Ru, Rh, Cd, and Pt.

According to another aspect of the present embodiments, there is provided an organic light emitting display device including: a substrate; a buffer layer disposed on the substrate; an active layer disposed on the buffer layer, including a source region, a drain region, and a channel region, and comprising a polysilicon layer; a gate insulation layer disposed on the active layer; a gate electrode facing the channel region on the gate insulation layer; a source electrode and a drain electrode respectively contacting the source region and the drain region by penetrating through a first interlayer insulating layer disposed on the gate electrode, the active layer, and the buffer layer; a first electrode contacting any one of the source electrode and the drain electrode by penetrating through a second interlayer insulating layer formed on the source electrode, the drain electrode, and the first interlayer insulating layer, and extending above the second interlayer insulating layer; an organic layer including an emission layer disposed on the first electrode; and a second electrode disposed on the organic layer, wherein the polysilicon layer includes a crystallization seed having a pyramid shape on an interface between the buffer layer and the polysilicon layer.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF CERTAIN INVENTIVE EMBODIMENTS

Hereinafter, the present embodiments will be described more fully with reference to the accompanying drawings, in which exemplary embodiments are shown.

FIGS. 2A through 2E are diagrams sequentially illustrating a method of crystallizing a silicon layer, according to an embodiment.

Figure 2A:
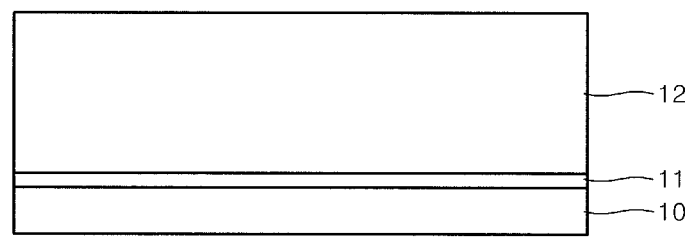
FIGS. 2A through 2E are diagrams sequentially illustrating a method of crystallizing a silicon layer, according to an embodiment.

Referring to FIG. 2A, a buffer layer 11 is disposed on a substrate 10. Then, an amorphous silicon layer 12 is disposed on the buffer layer 11.

The substrate 10 may comprise transparent glass, but a material of the substrate 10 is not limited thereto, and may comprise transparent plastic. A plastic substrate may comprise an insulating organic material.

In order to prevent diffusion of moisture or impurities generated in the substrate 10, the buffer layer 11 may be disposed on the substrate 10. The buffer layer 11 may comprise a silicon oxide ($SiO_2$), a silicon nitride (SiNx), or the like.

The amorphous silicon layer 12 is disposed on the buffer layer 11. The amorphous silicon layer 12 may be formed by using one of various methods, like plasma enhanced chemical vapor deposition (PECVD), low pressure chemical vapor deposition (LPCVD), etc.

Figure 2B:
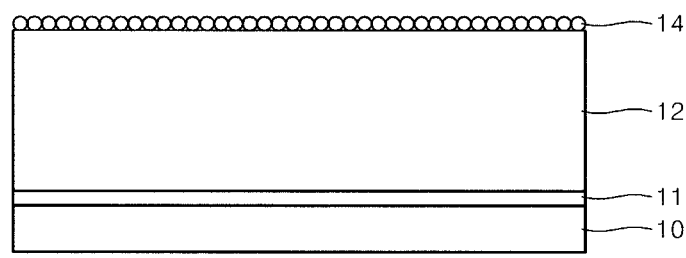

Referring to FIG. 2B, a catalyst metal layer 14 is disposed on the amorphous silicon layer 12. The catalyst metal layer 14 may comprise a metal, such as, for example, Ni, Pd, Ti, Ag, Au, Al, Sn, Sb, Cu, Co, Mo, Tr, Ru, Rh, Cd, or Pt. The catalyst metal layer 14 may be formed by using physical vapor deposition (PVD) such as sputtering, chemical vapor deposition (CVD) such as atomic layer deposition (ALD), or a doping method such as ion implantation. As shown in FIG. 2B, catalyst metals of the catalyst metal layer 14 are not exist continuous, but are discontinuous. The catalyst metal layer 14 is formed at a density smaller than a monolayer.

The catalyst metal layer 14 may have a density of from about $10^{11}$ to about $10^{15}$ atom/$cm^2$. When the density of the catalyst metal layer 14 is below about $10^{11}$ atom/$cm^2$, it is difficult to form the catalyst metal layer 14 that is reliable and has uniform density, and it is also difficult to measure the density. When the density of the catalyst metal layer 14 is above about $10^{15}$ atom/cm$^2$, the amount of the catalyst metals diffusing into the amorphous silicon layer 12 is too high, and thus a size of a crystal of polysilicon is reduced, and the catalyst metal is left on a polysilicon layer 20 forming a channel region, thereby deteriorating characteristics of a thin film transistor (TFT), for example, causing a leakage current.

Figure 2C:
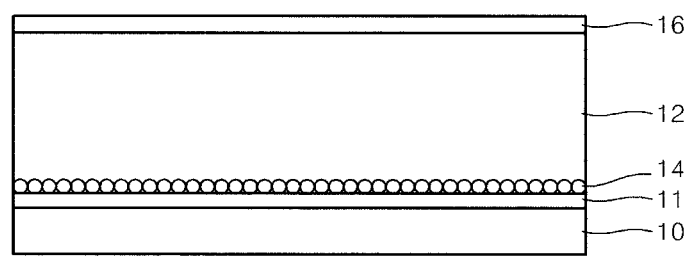

Referring to FIG. 2C, the catalyst metal layer 14 is thermal-treated so that the catalyst metals of the catalyst metal layer 14 are diffused into the amorphous silicon layer 12. Such a thermal-treatment process may be performed at a temperature from about 500 to about 800° C. The catalyst metals diffuse into the amorphous silicon layer 12 via the thermal-treatment process. The diffused catalyst metals gather on an interface between the amorphous silicon layer 12 and the buffer layer 11, and are diffused to two sides of the interface.

Figure 2D:
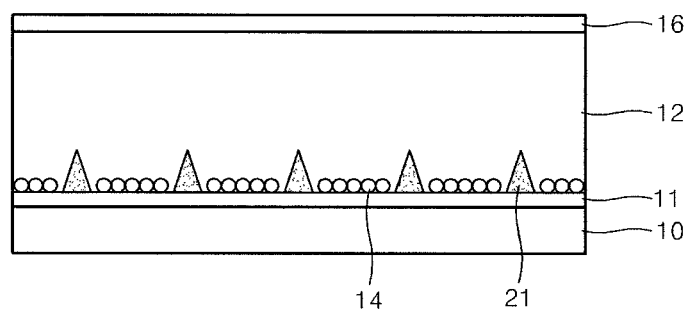

Referring to FIG. 2D, the catalyst metals gathered on the interface between the amorphous silicon layer 12 and the buffer layer 11 are thermal-treated so as to form metal silicide crystallization seeds 21, thereby growing silicon crystals.

Figure 2E:
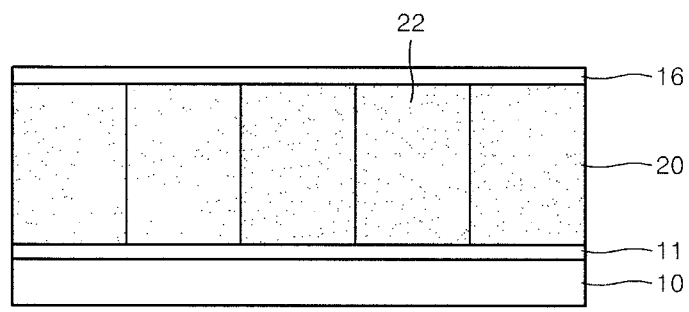

Referring to FIG. 2E, grains 22 of silicon crystals grown from each of the metal silicide crystallization seed 21 encounter each other to form the polysilicon layer 20.

A polysilicon layer formed according to a method of crystallizing silicon according to an embodiment will now be described.

Figure 3:
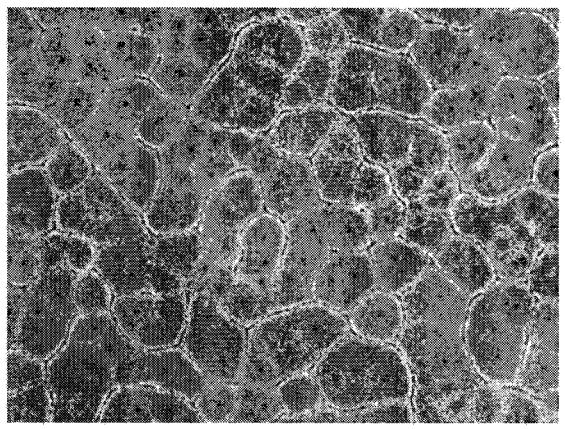
FIG. 3 is an optical microscope photographic image of a polysilicon layer formed according to a method of crystallizing silicon, according to an embodiment.

FIG. 3 is an optical microscope photographic image of a polysilicon layer formed according to a method of crystallizing silicon and using nickel as a catalyst metal, according to an embodiment. Referring to FIG. 3, sizes of grains are tens of micrometers. Also, crystallization seeds are distributed in the center of the grain or on a boundary of the grain as metal silicide diffuses outward when a crystal grows.

When amorphous silicon is crystallized to polysilicon by using a metal as a catalyst, growth behavior of silicon differs according to an amount and distribution of the metal. The growth behavior of silicon while forming the polysilicon layer, according to an embodiment will now be described.

Figure 4A:
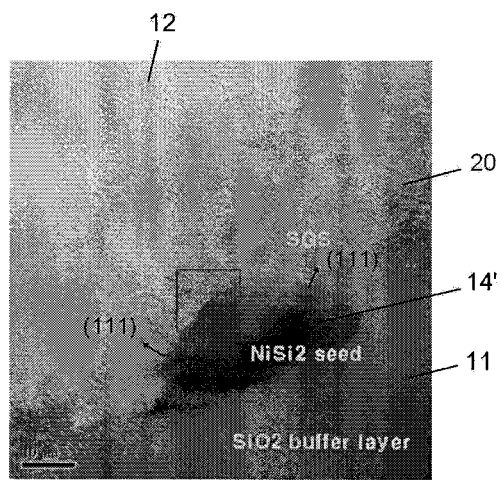
FIG. 4A is a transmission electron microscope (TEM) photographic image of a polysilicon layer during crystallization, according to an embodiment.

FIG. 4A is a transmission electron microscope (TEM) photographic image of the polysilicon layer 20 during crystallization, according to an embodiment. Here, a nickel layer is used as a catalyst metal layer.

Referring to FIG. 4A, the polysilicon layer 20 is disposed on the buffer layer 11, and a crystallization seed 14' exists on an interface between the polysilicon layer 20 and the buffer layer 11. The crystallization seed 14' has a pyramid shape having surfaces growing in a direction (111).

Figure 4B:
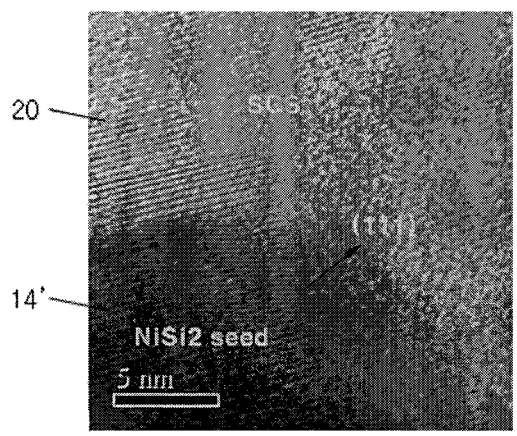
FIG. 4B is an enlarged TEM photographic image of an interface between a crystallization seed and the polysilicon layer of FIG. 4A.

FIG. 4B is an enlarged TEM photographic image of an interface between the crystallization seed 14' and the polysilicon layer 20 of FIG. 4A. Referring to FIG. 4B, it is shown that a crystal growth direction of the polysilicon layer 20 is the direction (111) similar to the growth direction of the crystallization seed 14'.

Figure 4C:
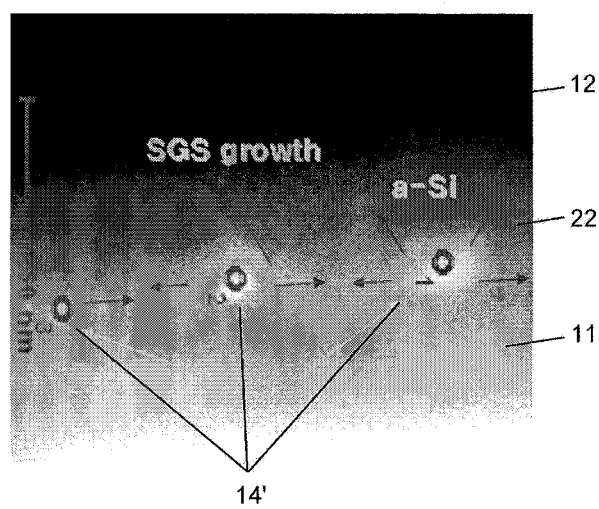
FIG. 4C is a scanning transmission electron microscope (STEM) photographic image showing distribution and a growth direction of a crystallization seed during crystallization of a polysilicon layer, according to an embodiment.

FIG. 4C is a scanning transmission electron microscope (STEM) photographic image showing distribution and the growth direction of the crystallization seed 14' during crystallization to the polysilicon layer 20, according to an embodiment. Referring to FIG. 4C, the polysilicon layer 20 is disposed on the buffer layer 11, and the amorphous silicon layer 12 that is not yet crystallized is disposed on the polysilicon layer 20. Also, a plurality of the crystallization seeds 14' exist on the interface between the buffer layer 11 and the polysilicon layer 20. The crystallization seed 14' has a pyramid shape, and thus grows in the direction (111).

Referring to FIGS. 4A through 4C, it is determined that the amorphous silicon layer 12 is crystallized to form the polysilicon layer 20 as the silicon crystals grow and encounter each other in the same direction as the growth direction of the crystallization seeds 14' distributed on the interface between the amorphous silicon layer 12 and the buffer layer 11 and having the pyramid shape.

Figure 5:
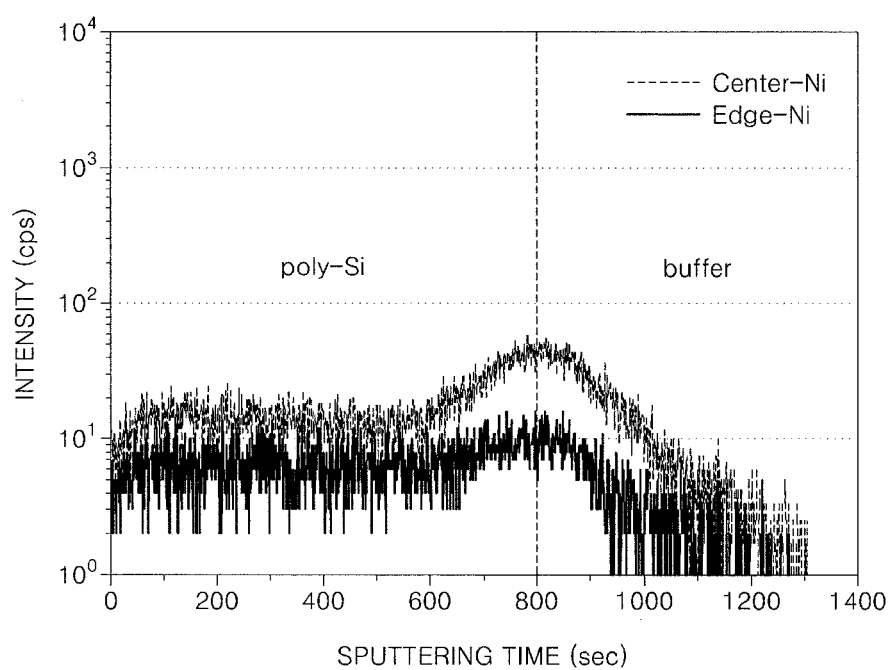
FIG. 5 is a secondary ion mass spectrum (SIMS) of a polysilicon layer according to an embodiment.

FIG. 5 is a secondary ion mass spectrum (SIMS) of a polysilicon layer according to an embodiment. According to the current embodiment, a nickel layer is used as a catalyst metal layer so as to crystallize an amorphous silicon layer on a buffer layer to form a polysilicon layer. Concentration of nickel is measured while sputtering the polysilicon layer formed on the buffer layer. Referring to FIG. 5, the concentration of nickel is uniformly low in the polysilicon layer, increases in the interface between the polysilicon layer and the buffer layer, and reduces in the buffer layer. Referring to FIGS. 4A, 4C, and 5, it is determined that crystallization seeds exist in an interface between a polysilicon layer and a buffer layer.

Figure 6:
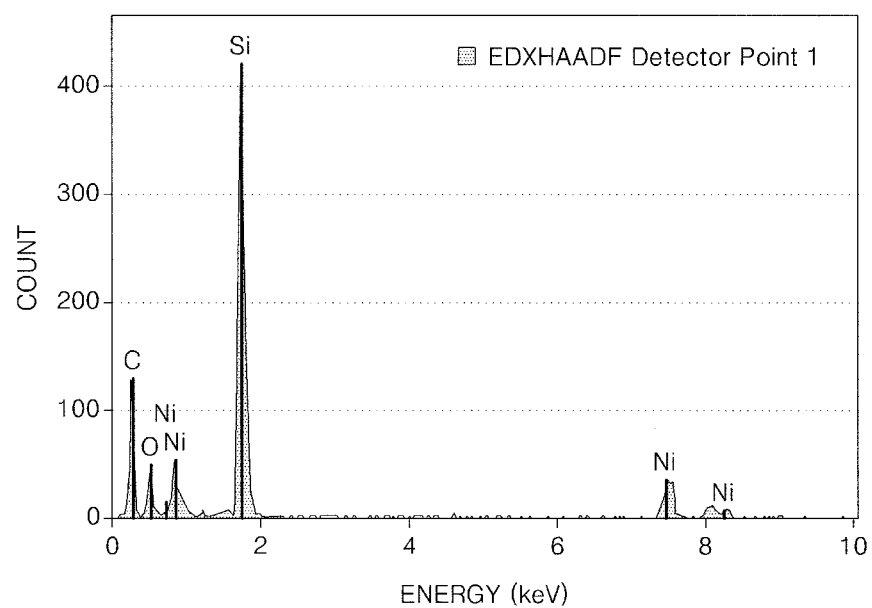
FIG. 6 is an energy dispersive X-ray (EDX) spectrum of a crystallization seed shown in FIGS. 4A through 4C.

FIG. 6 is an energy dispersive X-ray (EDX) spectrum of the crystallization seeds 14' shown in FIGS. 4A through 4C. Silicon (Si) and nickel (Ni) peaks are shown in FIG. 6, and it is determined that the crystallization seeds 14' of FIGS. 4A through 4C are nickel silicide based on FIG. 6. Nickel from the nickel layer, e.g., the catalyst metal layer, diffuses to the interface between the buffer layer 11 and the amorphous silicon layer 12 to form nickel silicide having a pyramid shape, and the nickel silicide turns into the crystallization seed 14' that helps the polysilicon layer 20 to be crystallized in the same direction as the growth direction of the crystallization seed 14'.

Figure 7:
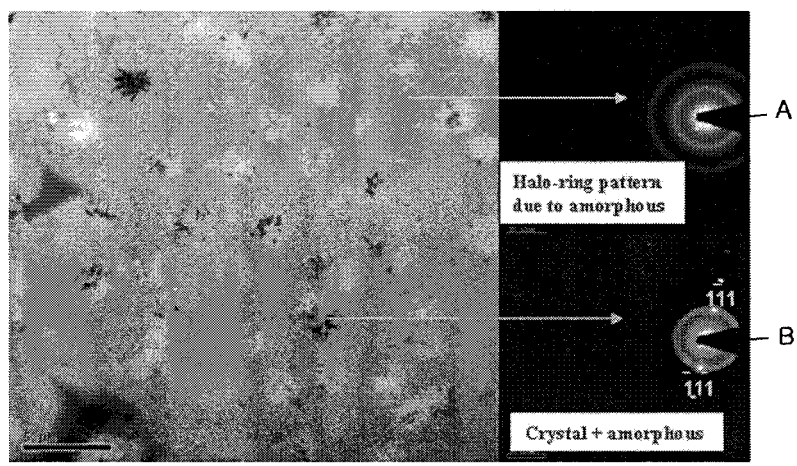
FIG. 7 is a TEM photographic image and shows electron diffraction patterns of an amorphous silicon layer during initial crystallization, according to an embodiment.

FIG. 7 is a TEM photographic image and shows electron diffraction patterns of an amorphous silicon layer during initial crystallization, according to an embodiment. A top electron diffraction pattern A is a background of the TEM photographic image, e.g., a pattern of amorphous silicon, and a bottom electron diffraction pattern B is a pattern region of the TEM photographic image, e.g., crystallized region. A halo-ring pattern of the electron diffraction pattern A is due to un-crystallized amorphous silicon, and a bright point of the electron diffraction pattern B is due to a crystal in a direction (111). Referring to FIG. 7, it is determined that polysilicon grows in the direction (111) during initial growth. After the initial growth, the polysilicon grows in various directions including direction (110).

Figure 8A:
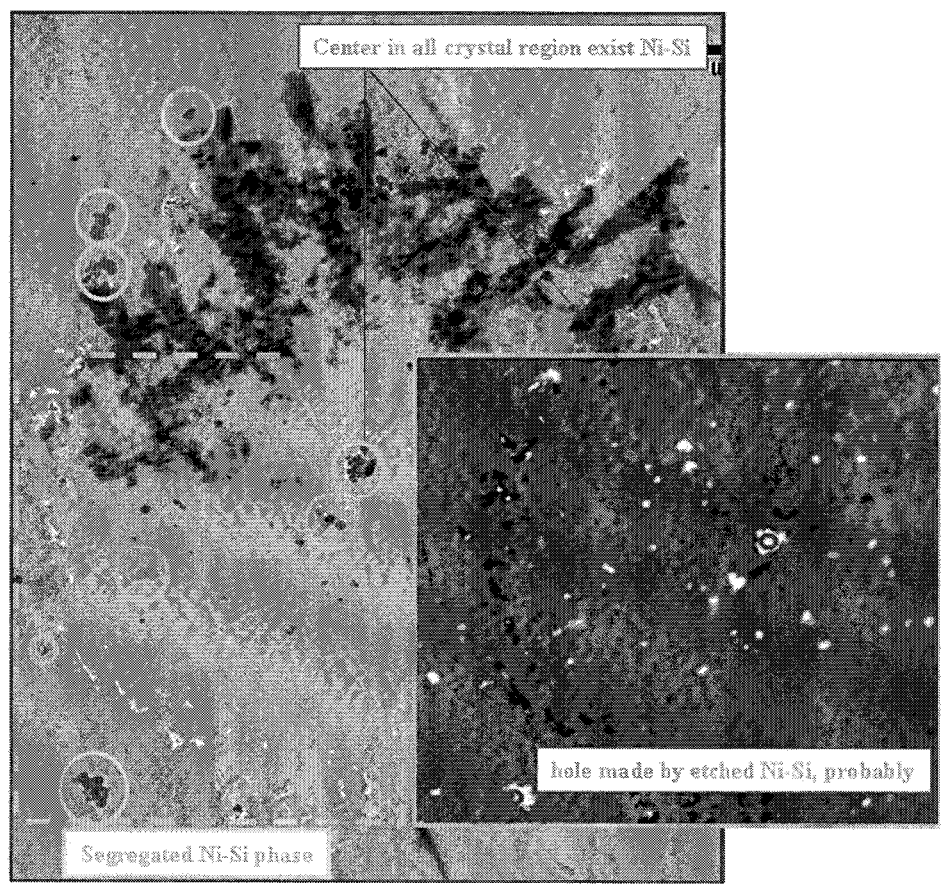
FIG. 8A is a TEM photographic image of a polysilicon layer during initial crystallization, according to an embodiment.
Figure 8B:
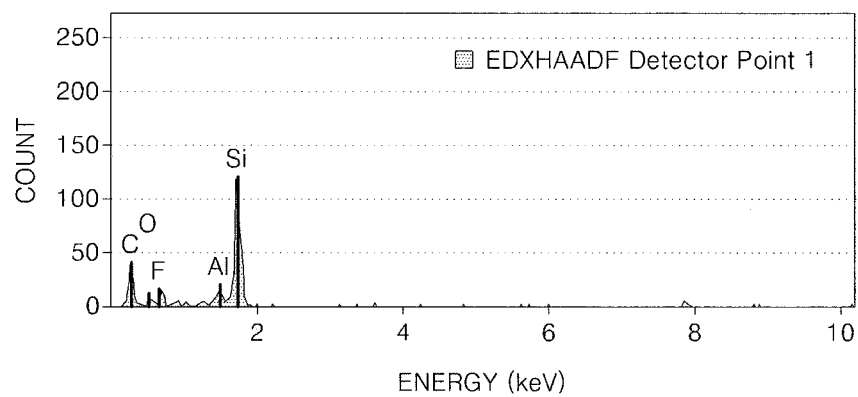
FIG. 8B is an EDX spectrum of a part of the polysilicon layer of FIG. 8A.
Figure 8C:
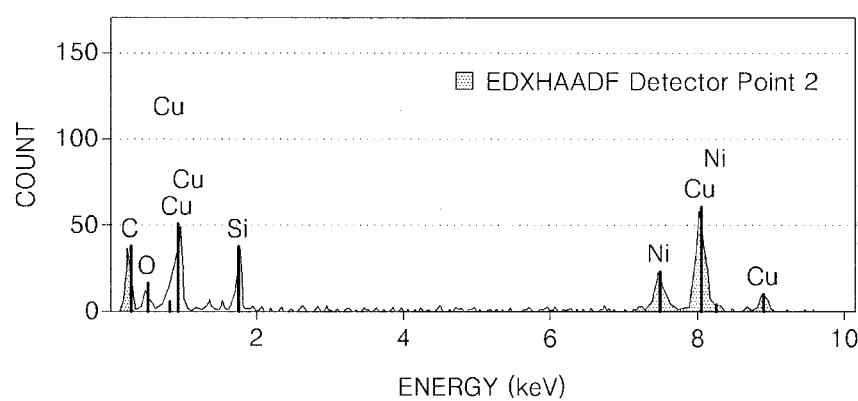
FIG. 8C is an EDX spectrum of another part of the polysilicon layer of FIG. 8A.

FIG. 8A is a TEM photographic image of a polysilicon layer during initial crystallization, according to an embodiment. FIG. 8B is an EDX spectrum of a crystallized black region of the polysilicon layer of FIG. 8A, and FIG. 8C is an EDX spectrum of circled black dots in an amorphous silicon region in front of the crystallized black region of the polysilicon layer of FIG. 8A. Referring to FIG. 8B, it is determined that only silicon exists in the crystallized black region since only a silicon peak is shown and no nickel peak is shown. Referring to FIG. 8C, it is determined that a catalyst metal forms a crystallization seed in the amorphous silicon region in front of the crystallized black region since the nickel peak and the silicon peak exist together. Accordingly, it is determined that the crystals of the polysilicon layer grow from at least one crystallization seed. Also, a growth behavior of a silicon crystal, which linearly grows as in metal induced lateral crystallization (MILC) may be inferred from FIG. 8A.

The mechanism of forming polysilicon according to crystallization has been described above with reference to FIGS. 4A through 4C, FIGS. 5 through 7, and FIGS. 8A through 8C.

Figure 9A:
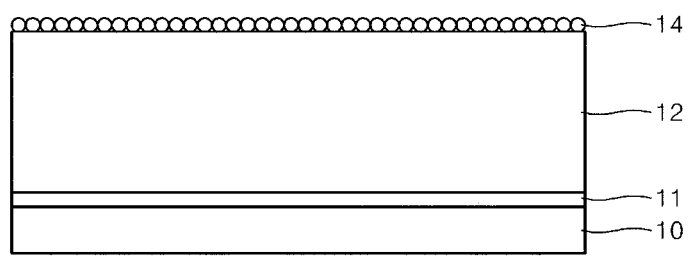
FIG. 9A through 9D are conceptual diagrams sequentially illustrating a crystallization mechanism of a polysilicon layer, according to an embodiment.

FIG. 9A through 9D are conceptual diagrams sequentially illustrating a crystallization mechanism of a polysilicon layer, according to an embodiment. In FIG. 9A, the catalyst metal layer 14 is disposed on the amorphous silicon layer 12. Referring to FIG. 9A, the amorphous silicon layer 12 is disposed on the buffer layer 11 on the substrate 10, and the catalyst metal layer 14 is disposed on the amorphous silicon layer 12. Here, metal density of the catalyst metal layer 14 is controlled to be below or equal to $10^{15}$ atom/cm$^2$.

Figure 9B:
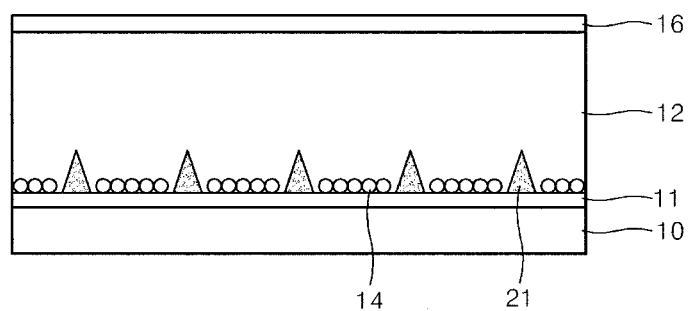

Referring to FIG. 9B, since the amount of catalyst metals is very small, e.g., equal to or less than about $10^{15}$ atom/cm$^2$, the catalyst metals from the catalyst metal layer 14 quickly diffuses into the amorphous silicon layer 12 according to thermal-treatment. Since the catalyst metals quickly diffuses in the amorphous silicon layer 12 but a diffusion speed of the catalyst metals reduces at the buffer layer 11, the catalyst metals gather in an interface having high crystal defection density. Accordingly, the density of the catalyst metals is higher in the interface between the buffer layer 11 and the amorphous silicon layer 12 than the top of the amorphous silicon layer 12. The metal silicide crystallization seed 21 is formed by thermal-treating the catalyst metals on the interface, and then the silicon crystals grow in an upward direction and a width direction from the metal silicide crystallization seed 21.

Figure 9C:
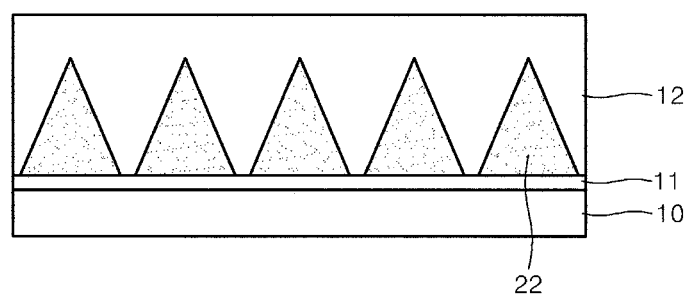

Referring to FIG. 9C, as the silicon crystals grow from the metal silicide crystallization seed 21 below the amorphous silicon layer 12, the silicon crystals encounter neighboring silicon crystals, thereby forming the grains 22.

Figure 9D:
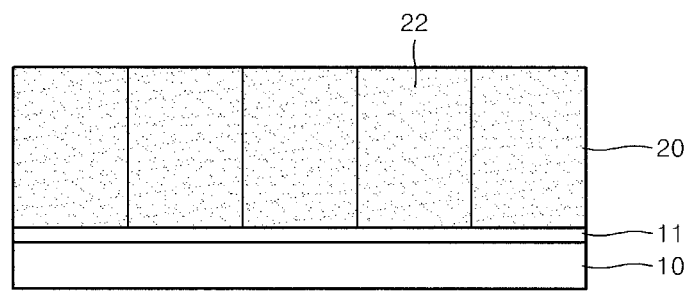

FIG. 9D shows the polysilicon layer 20 that is formed by crystallizing the amorphous silicon layer 12. The sizes of the grains 22 of the polysilicon layer 20 are in a range from several to hundreds of μm. Remaining metals (not shown) or remaining metal silicide seeds (not shown) are mostly distributed in the bottom of the polysilicon layer 20, and some exist on a boundary of the grains 22.

Figure 1:
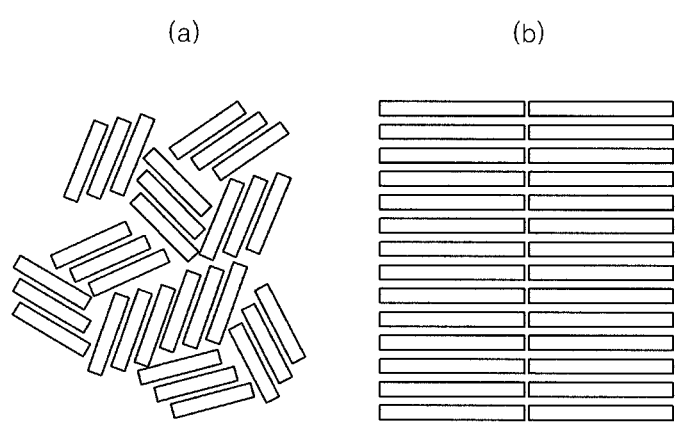
FIGS. 1A and 1B are conceptual diagrams illustrating crystal growth characteristics of silicon in methods of crystallizing silicon by using a metal as a catalyst.
Figure 10:
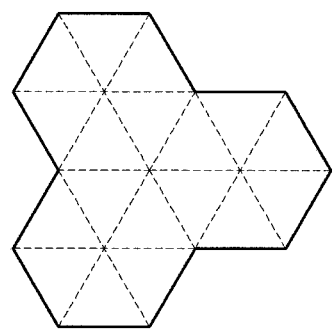
FIG. 10 is a conceptual diagram illustrating a shape of a crystal of polysilicon, according to an embodiment.

FIG. 10 is a conceptual diagram illustrating a shape of a crystal of polysilicon, according to an embodiment. The polysilicon of FIG. 10 includes grains grown in the direction (111), unlike the shapes illustrated in FIG. 1A or 1B. Also, crystals that grew around a seed at the same speed encounter each other to form polysilicon. Since directions of the crystals forming the polysilicon are uniform in the direction (111), electric characteristics may be improved.

Figure 11:
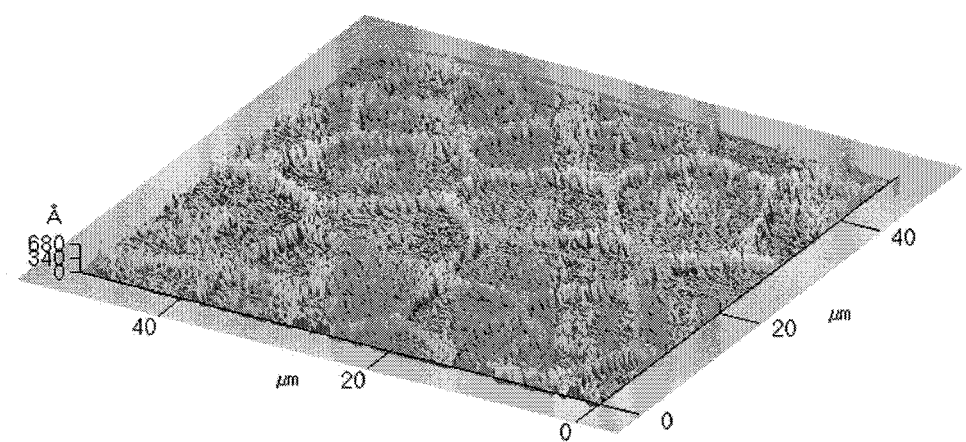
FIG. 11 is an atomic force microscope (AFM) photographic image obtained by measuring a topography formed on a buffer layer after selectively removing a polysilicon layer.

FIG. 11 is an atomic force microscope (AFM) photographic image obtained by measuring a topography formed on a buffer layer after forming a polysilicon layer according to an embodiment on the buffer layer and then selectively removing the polysilicon layer. The polysilicon layer is selectively removed by drying etching. The topography of FIG. 11 shows crystallization seeds remaining on the buffer layer, and shows distribution of the crystallization seeds for forming the polysilicon layer.

Referring to FIG. 11, metal silicide seeds are disposed in the center and boundary of the grain of the polysilicon layer, and the size of the metal silicide seeds is several μm if largest, in the center of the grain. This may be because the crystallization seeds remaining during an initial crystallization starting process exist in the center of the grain, and as the crystallization seed grows, the crystallization seeds encounter each other at the boundary of the grains.

FIGS. 12A through 12D are cross-sectional views sequentially illustrating a method of preparing a TFT by using a polysilicon layer, according to an embodiment.

Figure 12A:
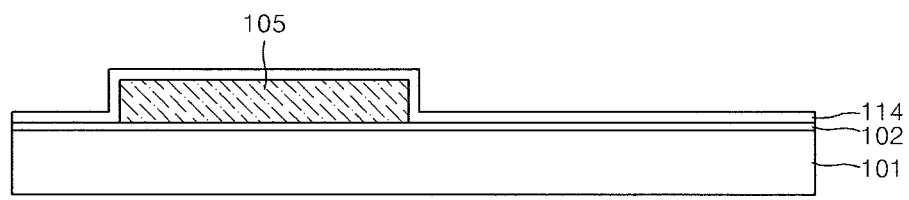
FIGS. 12A through 12D are cross-sectional views sequentially illustrating a method of preparing a thin film transistor (TFT) by using a polysilicon layer, according to an embodiment.

Referring to FIG. 12A, a polysilicon layer (not shown) is formed and patterned on a buffer layer 102 disposed on a substrate 101 to form an active layer 105. Remaining catalyst metals or silicides of the catalyst metals of the active layer 105 exist in an interface between the active layer 105 and the buffer layer 102, and thus are away from a channel region on the top of the active layer 105. Accordingly, leakage current characteristics of the TFT may be improved.

Figure 12B:
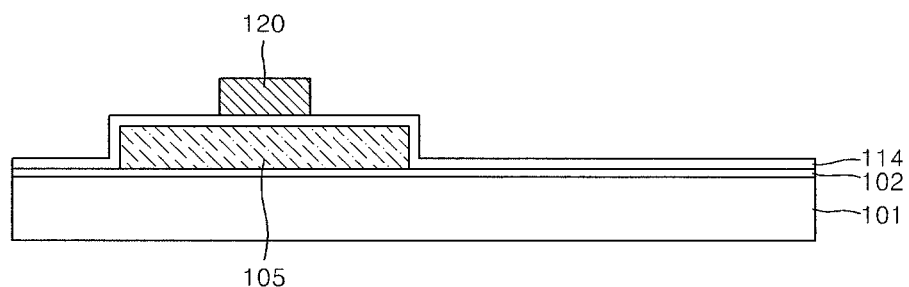

Referring to FIG. 12B, a gate insulation layer 114 is disposed on the active layer 105, and a conductive layer (not shown) is formed and patterned on the gate insulation layer 114 to form a gate electrode 120. The gate insulation layer 114 may be an insulation layer, such as a silicon oxide layer or a silicon nitride layer. The gate electrode 120 may comprise Au, Ag, Cu, Ni, Pt, Pd, Al, Mo, W, Ti, or an alloy thereof.

Figure 12C:
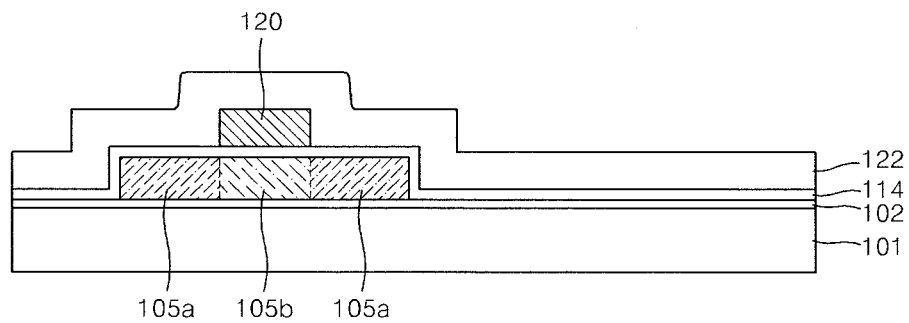

Referring to FIG. 12C, source/drain regions 105a are formed at each end of the active layer 105, and a first interlayer insulating layer 122 is formed. A channel region 105b is formed in the active layer 105 between the source/drain regions 105a. The source/drain region 105b may be formed by performing ion doping by using the gate electrode 120 as a mask in a self-alignment method. The first interlayer insulating layer 122 may be formed in a single layer or a plurality of layers, using silicon oxide layers or silicon nitride layers.

Figure 12D:
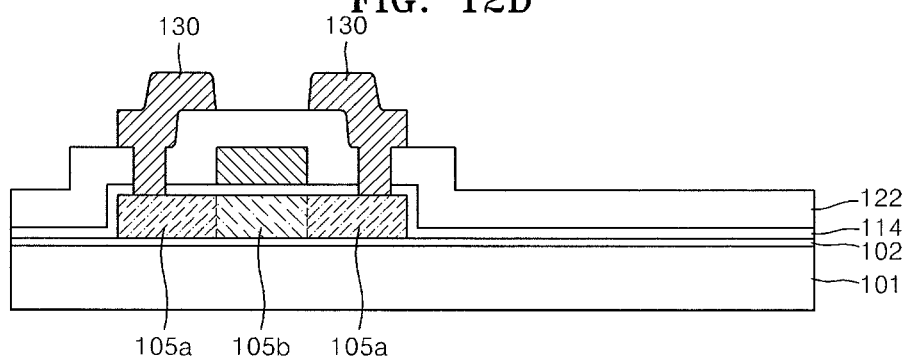

Referring to FIG. 12D, source/drain electrodes 130 contacting the source/drain regions 105a are formed in the first interlayer insulating layer 122. The source/drain electrodes 130 may be formed by forming a hole (not shown) exposing the top surface of the source/drain regions 105a in the first interlayer insulating layer 122, and then forming and patterning the conductive layer to be buried in the hole. The conductive layer may comprise any one of various materials, such as Au, Ag, Cu, Ni, Pt, Pd, Al, Mo, W, Ti, and an alloy thereof.

Figure 13:
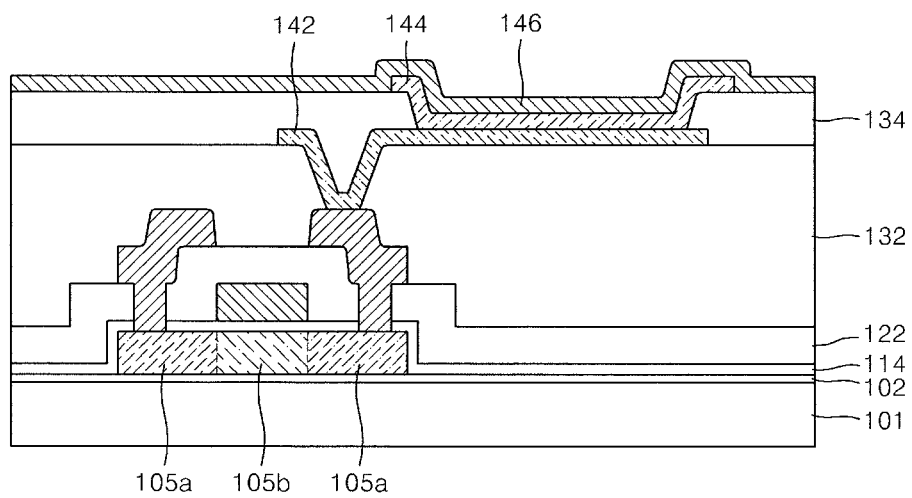
FIG. 13 is a cross-sectional view of an organic light emitting display device using a TFT, according to an embodiment.

FIG. 13 is a cross-sectional view of an organic light emitting display device using a TFT, according to an embodiment.

Referring to FIG. 13, a TFT of the organic light emitting display device is prepared according to the method of FIGS. 12A through 12D. A second interlayer insulating layer 132 is formed on the TFT. The second interlayer insulating layer 132 may be an organic or inorganic layer.

A first electrode 142 of a pixel unit penetrates through the second interlayer insulating layer 132 to contact any one of the source/drain electrodes 130, and extends upward from the second interlayer insulating layer 132. The first electrode 142 may comprise a transparent conductive oxide, such as indium tin oxide (ITO) or indium zinc oxide (IZO).

An organic layer 144 is formed to contact the first electrode 142 exposed by a pixel defining layer 134 disposed on the second interlayer insulating layer 132. The pixel defining layer 134 may be an organic or inorganic layer. The organic layer 144 includes an emission layer (not shown), and may further include at least any one of a hole injection layer (HIL) (not shown), a hole transport layer (HTL) (not shown), an electron transport layer (ETL) (not shown), and an electron injection layer (EIL) (not shown). A second electrode 146 is formed on the organic layer 144. The second electrode 146 may comprise a metal, such as Mg, Ag, Al, Ca, or an alloy thereof.

Figure 14:
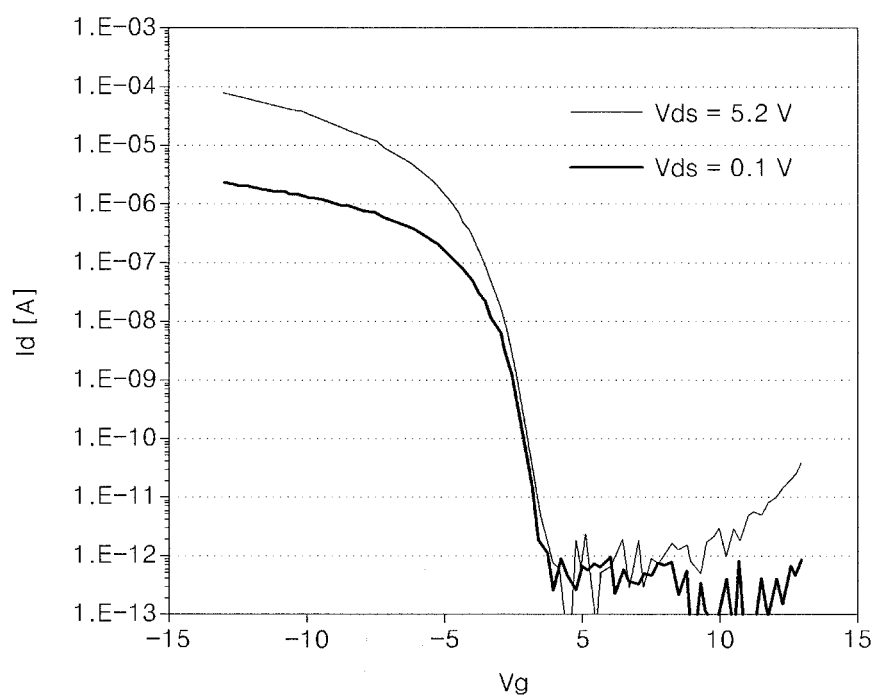
FIG. 14 is a transmission graph of a TFT using a polysilicon layer, according to an embodiment.

FIG. 14 is a transmission graph of a TFT using a polysilicon layer, according to an embodiment. Referring to FIG. 4, it is determined that the TFT has a large current and good leakage current characteristics.

According to the present embodiments, a polysilicon layer, which has crystals having a size of hundreds of μm or below and formed in a direction (111), and catalyst metals existing on an interface between the polysilicon layer and a buffer layer, may be formed. Also, a TFT and an organic light emitting display device having a large current and low leakage current may be formed by using the polysilicon layer as an active layer.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of crystallizing a silicon layer, the method comprising:
   forming an amorphous silicon layer on a buffer layer on a substrate;
   forming a catalyst metal layer consisting of a catalyst metal directly contacting the amorphous silicon layer to have a density of from about $10^{11}$ to about $10^{15}$ atom/cm$^2$; and
   thermal-treating the amorphous silicon layer so that a crystalline seed having a pyramid shape is formed on the interface between the amorphous silicon layer and the buffer layer as a catalyst metal of the catalyst metal layer diffuses into the amorphous silicon layer, and forming a polysilicon layer as a silicon crystal grows by the crystalline seed.

2. The method of claim 1, wherein the silicon crystal grows in a same direction as the crystallization seed having the pyramid shape.

3. The method of claim 1, wherein the silicon crystal first grows in a first direction.

4. The method of claim 1, wherein a component of the catalyst metal is on an interface between the polysilicon layer and the buffer layer, after the polysilicon layer is formed.

5. The method of claim 1, wherein the crystallization seed comprises a silicide of the catalyst metal.

6. The method of claim 1, wherein the catalyst metal layer comprises at least one selected from the group consisting of Ni, Pd, Ti, Ag, Au, Al, Sn, Sb, Cu, Co, Mo, Tr, Ru, Rh, Cd, and Pt.

7. The method of claim 1, wherein the amorphous silicon layer is formed according to plasma enhanced chemical vapor deposition (PECVD), or low pressure chemical vapor deposition (LPCVD).

8. The method of claim 1, wherein the catalyst metal layer is formed according to physical vapor deposition (PVD), chemical vapor deposition (CVD), or a doping method.

9. The method of claim 8, wherein the catalyst metal layer is formed according to atomic layer deposition (ALD).

* * * * *